(12) United States Patent
Cariello

(10) Patent No.: US 10,949,297 B2
(45) Date of Patent: Mar. 16, 2021

(54) NAND DEVICE MIXED PARITY MANAGEMENT

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 16/210,730

(22) Filed: Dec. 5, 2018

(65) Prior Publication Data

US 2020/0183779 A1 Jun. 11, 2020

(51) Int. Cl.
*G06F 11/10* (2006.01)
*G11C 29/42* (2006.01)
*G11C 29/52* (2006.01)

(52) U.S. Cl.
CPC ...... *G06F 11/1068* (2013.01); *G06F 11/1004* (2013.01); *G06F 11/1044* (2013.01); *G11C 29/42* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 6,785,783 | B2* | 8/2004 | Buckland | G06F 11/2058 711/153 |
| 9,105,305 | B2* | 8/2015 | Werner | G11B 20/1883 |
| 9,306,599 | B2* | 4/2016 | Flynn | G06F 11/073 |
| 10,133,625 | B2* | 11/2018 | Bandic | G06F 11/1044 |
| 10,176,039 | B2* | 1/2019 | Amato | G06F 3/0619 |
| 10,417,092 | B2* | 9/2019 | Brennan | G06F 3/064 |

* cited by examiner

*Primary Examiner* — Phung M Chung
(74) *Attorney, Agent, or Firm* — Schwegman Lundberg & Woessner, P.A.

(57) ABSTRACT

Devices and techniques for NAND device mixed parity management are described herein. A first portion of data that corresponds to a first data segment and a second data segment—respectively defined with respect to a structure of a NAND device—are received. A parity value using the first portion of data and the second portion of data is computed and then stored for error correction operations.

24 Claims, 6 Drawing Sheets

NAND DEVICE MIXED PARITY MANAGEMENT

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EPROM), static RAM (SRAM), erasable programmable ROM (EPROM), resistance variable memory, such as phase-change random-access memory (PCRAM), resistive random-access memory (RRAM), or magnetoresistive random-access memory (MRAM), among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
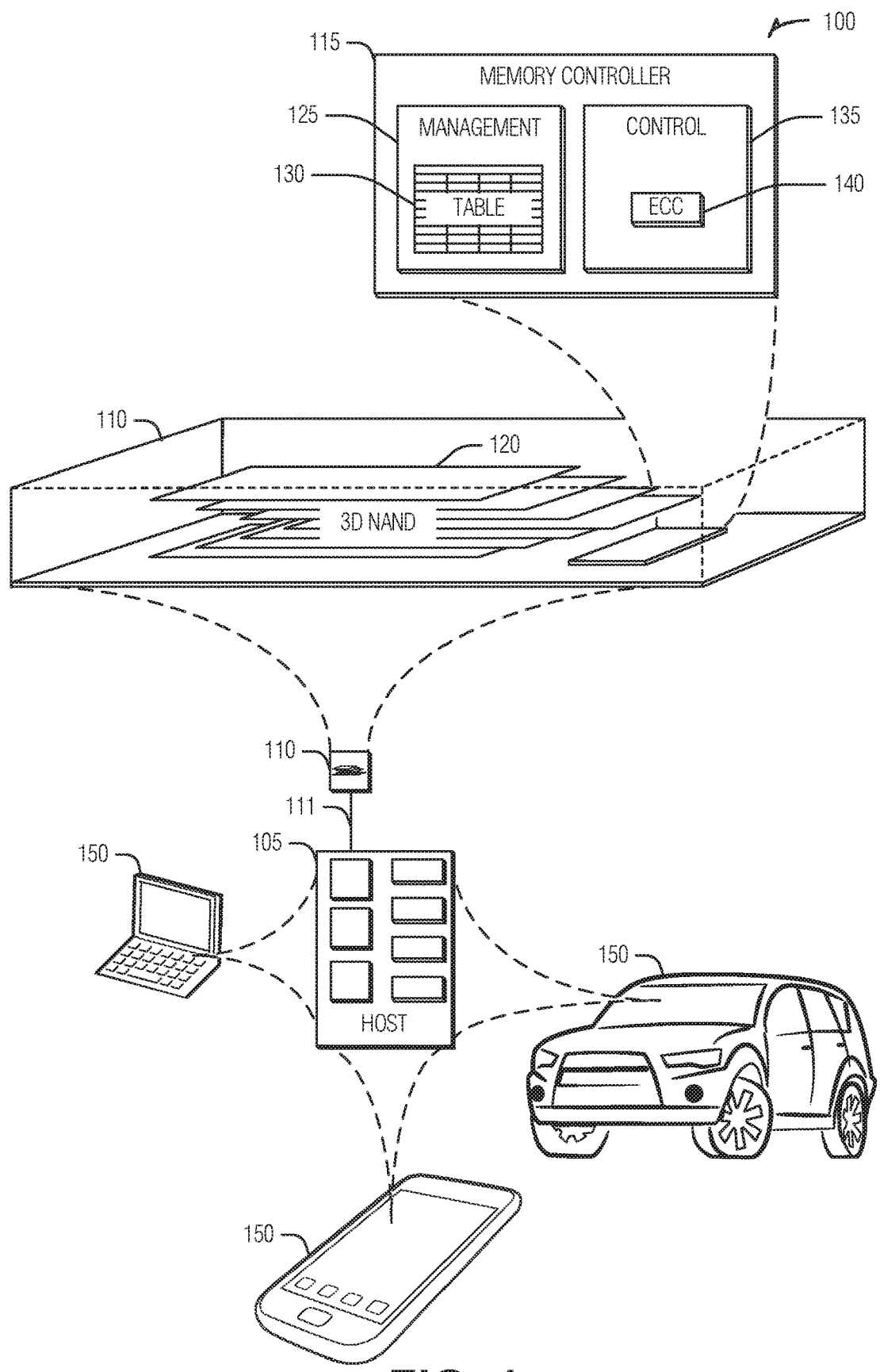
FIG. 1 illustrates an example of an environment including a memory device.

Flash memory devices have implemented error correction codes (ECC) to detect errors and, in some instances, recover from them. However, as device geometries continued to shrink and controller complexity increased, a redundant array of independent device (RAIN) was employed. RAIN is conceptually related to the parity redundant array of independent drive (RAID) schemes used to protect hard drive-based storage. Because flash devices already used parallelism between devices (e.g., die, blocks, pages, etc.), RAIN techniques do not generally employ the parallel schemes from RAID, but rather the error recovery techniques.

Due to limited numbers of flash (e.g., NAND) die in memory devices (e.g., two, four, or eight die), and due to design decisions to include overprovisioning (e.g., the memory device has a capacity about 6.9% greater than its advertised capacity), it is often not feasible to dedicate a die or even a plane to the parity data. To overcome this issue, parity accumulation across multiple pages in a given block has been used. Here, parity is not written together (e.g., at the same time) with protected data, but is rather is temporarily accumulated (e.g., in a swap block of the memory device) before being written with the protected data.

Generally, RAIN parity involves mapping defined data segments, such as a block, to a parity slot. The parity slot is generally implemented in a fast volatile memory of a memory controller for the flash device. Device data segments (e.g., pages of the block) are exclusively OR-ed (XORed) with each other as they are added to the parity slot. Often, once one of the set of defined data segments is complete (e.g., a defined grouping of pages for a block are received), the final parity value is flushed to a swap block, or the like. Once the write is completed, such as when the data is written to a block, the parity values from the swap block are generally written to the block as well. In this way, the parity values can be used to reconstruct the data written to the block in the case of error.

In some RAIN schemes, such as spinning RAIN, many parity groups can be kept active at the same time, which can require greater volatile memory in the device. Also, these RAIN techniques can involve additional active cursors (e.g., blocks open for writing, or "open blocks") to which different data (e.g., host data, garbage collection data, system data, etc.) is being written. Here, for each of these cursors, parity slots are maintained until the logical block is complete—for example the logical block is closed such that no more data will be written to the block (e.g., because it is full). This generally involves additional parity slot memory to be maintained, resulting in additional fast-physical memory for the memory controller, and thus increased costs or power consumption of the memory controller.

To address the parity memory efficiency issues of spinning RAIN, or similar techniques, parity can be accumulated between cursors—parity from multiple blocks is mixed—and saved together into the swap block. A parity-to-data reference (e.g., table) table to disentangle the parity values to, for example, reconstruct corrupted pages during a write to the physical device or to write the parity values for the same logical block (e.g., or a group of pages within the block) to the underlying hardware for read error protection. Mixing parity values from multiple cursors enables sequential filling of parity slots. Thus, as a parity slot fills, it can be flushed and used for the next page of data regardless of logical block instead of being held for the next page of data in the same logical block. This increased efficiency in parity slot memory enables smaller parity slot memories to service advanced RAIN techniques such as spinning RAIN. Additional details and examples are provided below.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 600 of FIG. 6.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110.

The memory manager 125 can include, among other things, circuitry or firmware, such as several components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a L2P mapping.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.). The array controller 135 can be distinguished from the memory controller 115 based on its level of operation in the memory device 110 in an example. Generally, the array controller 135 is present to address the fundamental reading and writing from the array 120 and is present in any memory device 110 whether or not the memory controller 115 is included in the memory device 110 (as illustrated) or external to the memory device (e.g., in the host 105).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data based on the ECC data maintained by the array controller 135. This enables the memory controller 115 to maintain integrity of the data transferred between the host 105 and the memory device 110 or maintain integrity of stored data. Part of this integrity maintenance can include removing (e.g., retiring) failing memory resources (e.g., memory cells, memory arrays, pages, blocks, etc.) to prevent future errors.

RAIN is another technique that can be employed by the memory device 110 to maintain data integrity. The array controller 135 can be arranged to implement RAIN parity data generation and storage in the array 120. As noted above, spinning RAIN is a technique to reduce exposure to certain device failures, such as a failure in a single physical block, word line, etc. However, spinning raid increases memory resources used to generate parity data during writes. These memory resources are typically SRAM to provide speed and mutability. However, when compared to flash devices, the SRAM is expensive in terms of die area, device complexity, and power consumption. Thus, implementing spinning RAIN using traditional parity generation techniques can lead to increased cost, complexity, or power consumption in the array controller 135. Mixed parity management provides a solution to this problem.

In mixed parity management, the memory resources used for incremental parity value generation (e.g., parity accumulation) are shared between data segments. For example, pages from a first block are combined with pages from a second block in a single SRAM parity slot to create an intermediate parity value. Thus, the first block data is mixed with the second block data. As data and the corresponding parity data are often stored together in the array, the mixed parity data is disentangled at some point after its accumulation in the intermediate parity memory resource. Although the disentanglement can impose additional processing on the memory device 110, the nature of NAND flash devices, for example, provides for numerous maintenance operations, such as garbage collection, or transferring the intermediate parity values to swap storage in the array 120 or to a final storage in the array 120. As the disentanglement can occur at a variety of times that will likely not affect the user experience working with the device 110, the disentanglement operations will likely not result in a noticeable impact on performance while enabling a more efficient array controller 135 to implement advanced RAIN techniques, such as spinning RAIN.

To implement mixed parity management, the array controller 135 is arranged to receive—e.g., from the host 105 via the memory controller 115—a first portion of data is received. Here, the first portion of data corresponds to a first data segment defined with respect to a structure of the memory device 110. In an example, the structure of the memory device 110 that defines the first data segment is a block. In an example, the first portion of data is a page of that block. Although the data segment is defined by a structure of the memory device 110, it is not necessarily directly associated with a given structure of the array 120. For example, the data segment can be a virtual (e.g., logical) block. The actual correspondence to a physical block in this case can be maintained by the memory manager 125. To implement spinning RAIN, for example, often entails spreading the pages for a single logical block over several physical blocks to achieve the single device failure protection afforded by the technique.

The portion of data also often has a direct correspondence to a structure in the array 120, such as a page. However, the portion of data is defined by the parity technique of the RAIN implemented by the memory device 110. Thus, the portion can be a group of pages, planes, or other divisions of data that are atomically combined to form parity data for the corresponding data segment.

The array controller 135 is arranged to receive a second portion of data that corresponds to a second data segment that is different than the first segment. Thus, if the first data segment is logical block A, then the second data segment is not logical block A (e.g., it is logical block B).

The array controller 135 is arranged to compute a parity value using the first portion of data and the second portion of data. Thus, the generated parity value is a mixed of the first data segment and the second data segment. As noted above, this is different than the traditional parity value generation, or accumulation, in which the parity values for the data segments would be segregated. In an example, the parity value is computed by applying an XOR operation between bits of the first portion of data and the second portion of data. In an example, the array controller 135 is arranged to maintain a data structure to store a mapping between the first portion of data, the second portion of data, and the parity value. An example of such as data structure is described below with respect to FIG. 4. The data structure enables disentangling of the parity data for a given data segment from the mixed parity data.

Once, the parity value is calculated, the array controller 135 is arranged to store the parity value. In an example, the parity value is stored in RAM (e.g., SRAM, DRAM, etc.) of the array controller. In an example, the parity value replaces a previous parity value for the first data segment in the RAM. In this example, the first portion or the second portion can be XORed to the previous parity value and replace the previous parity value. Thus, the combination of the first portion of data and the second portion of data happens via their individual combination with the previous parity value stored in the RAM. An example of this is described below with respect to FIGS. 2 and 3.

In an example, the array controller 135 is arranged to flush the parity data stored in the RAM to a physical block. This can be a swap block, perhaps implement as SLC flash for speed, to maintain the parity data until it is complete for a data segment. In an example, flushing the parity data includes disentangling (e.g., decoupling) parity data for the first portion of data and the second portion of data from parity data derived from the parity value prior to writing the parity data to a swap block. In this example, the disentanglement occurs during the flush, enabling traditional swap block writes to final destination blocks of the array 120 to proceed as they would have under traditional parity generation techniques.

In an example, the array controller 135 is arranged to decouple the parity data for the first portion of data and the second portion of data in response to a trigger. A first trigger was noted above, the flushing of the parity data from the RAM to the swap block. Other triggers can include writing the parity data to the final destination (e.g., physical block) in the array 120 or a write or read verification error for the data. Any of these events can include the computation of parity for a given data segment in the mixed parity data via the mixed parity data and the data structure indicating the constituent parts (e.g., pages in blocks) that are part of the mixed parity data.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
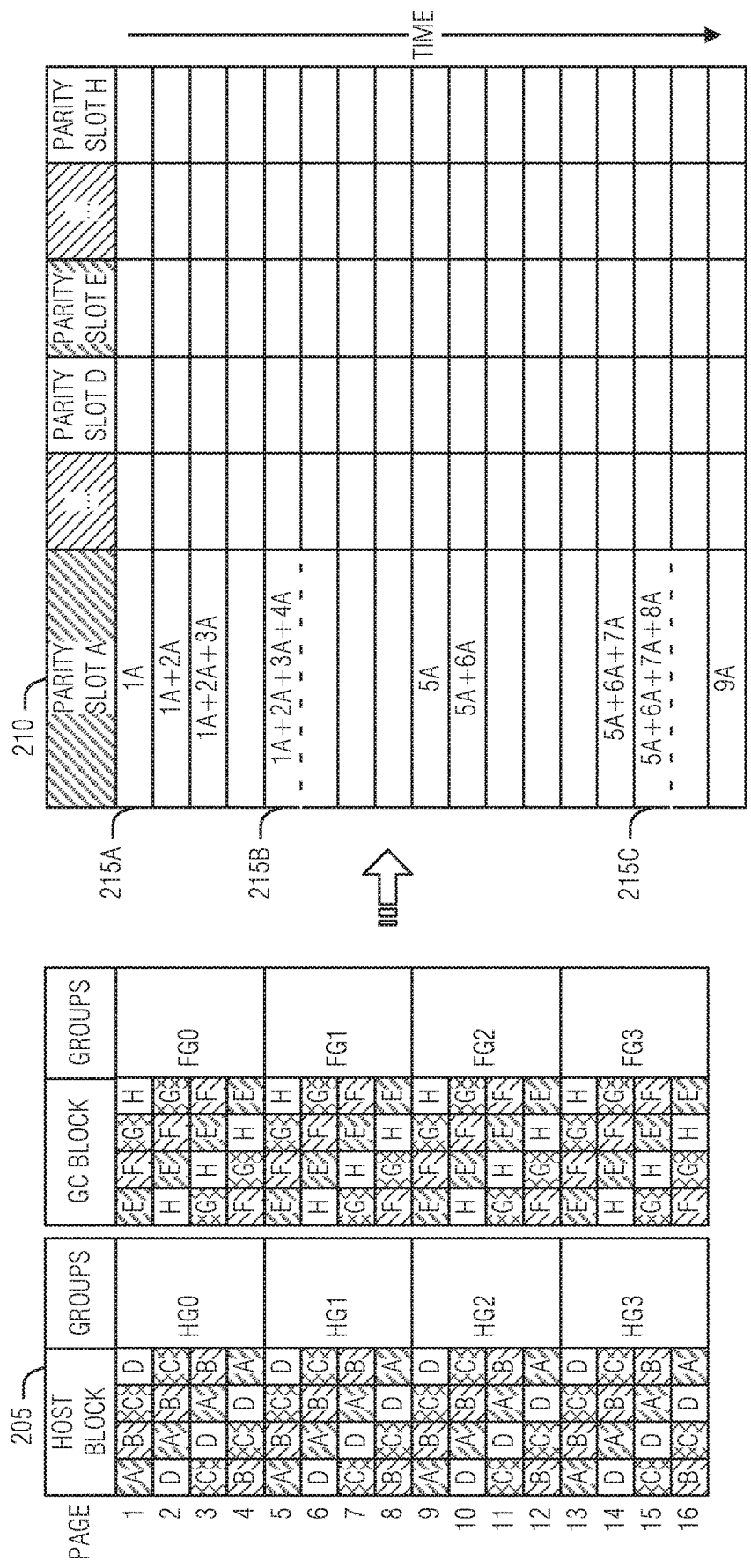
FIG. 2 illustrates an example of a parity mapping for a redundant array of independent NAND (RAIN).

FIG. 2 illustrates an example of a parity mapping for a redundant array of independent NAND (RAIN). The logical-to-physical mapping 205 illustrates a striped logical block across four physical blocks of, for example, a plane in a NAND flash die. Thus, logical block A occupies page one of physical block one, page two of physical block two, and so on as illustrated. Similarly, logical block D occupies page one of physical block four, page 2 of physical block one, and so on as illustrated. Also, as illustrated, the pages of a logical block can be grouped based on the modulus of the number of physical blocks across which the logical block is striped. Thus, the first four pages of logical block A when striped across four physical blocks, can be grouped (e.g., the illustrated group HG0). Not only can the user data (e.g., host blocks) be stripped, but the garbage collection blocks (e.g., GC blocks) can also be stripped and protected by RAIN parity.

The logical blocks are mapped to a parity slot 210 in memory of the memory controller. The mapping was often based on a direct manipulation of an attribute of the logical block to avoid the overhead of tracking the parity slot 210 to logical block mapping. Generally, the parity slot 2:10 is sized for a smallest unit of parity. Thus, where pages are XORed for parity, the parity slot 210 is the size of one page.

In operation, the contents of the parity slot 210 changes over time as additional pages of the logical block are added. Thus, the parity slot value at a first time 215A starts with the first page of logical block A (e.g., 1A). As time progresses, the value in the parity slot is changed to be a combination of a previous value and a current page of the logical block. Thus, the XOR result of pages 1A and 2A is XORed with the page 3A when page 3A arrives. This continues, if there is a page for the logical block, until the group is done, or some other criteria is met and the parity slot value at a second time 215B is flushed to a swap block 220, at a page 225 corresponding to the logical block (here A) and the group (here HG0). The third time 215C also correlates to another value that is flushed on group HG1. After a flush, the parity slot 210 is reset (e.g., erased, emptied, etc.) and parity accumulation begins again.

The swap block 220 is typically flash storage used as a workspace for the parity accumulation. When the logical block is completely written to physical blocks, then the parity data for the logical block is typically written to the physical blocks as well to collocate it with the data to which it pertains. Typically, the swap block 220 is SLC encoded for speed, as opposed to the MLC (e.g., TLC) encoding of the physical blocks ultimately holding the data or parity data.

As illustrated, the empty cells for the parity slot 210 represent time increments in which the value in the parity slot 210 did not change. It is this feature that can lead to a need for large memory controller memories (e.g., to maintain parity slots for all of the logical blocks A, B, C, and D) being written.

Figure 3:
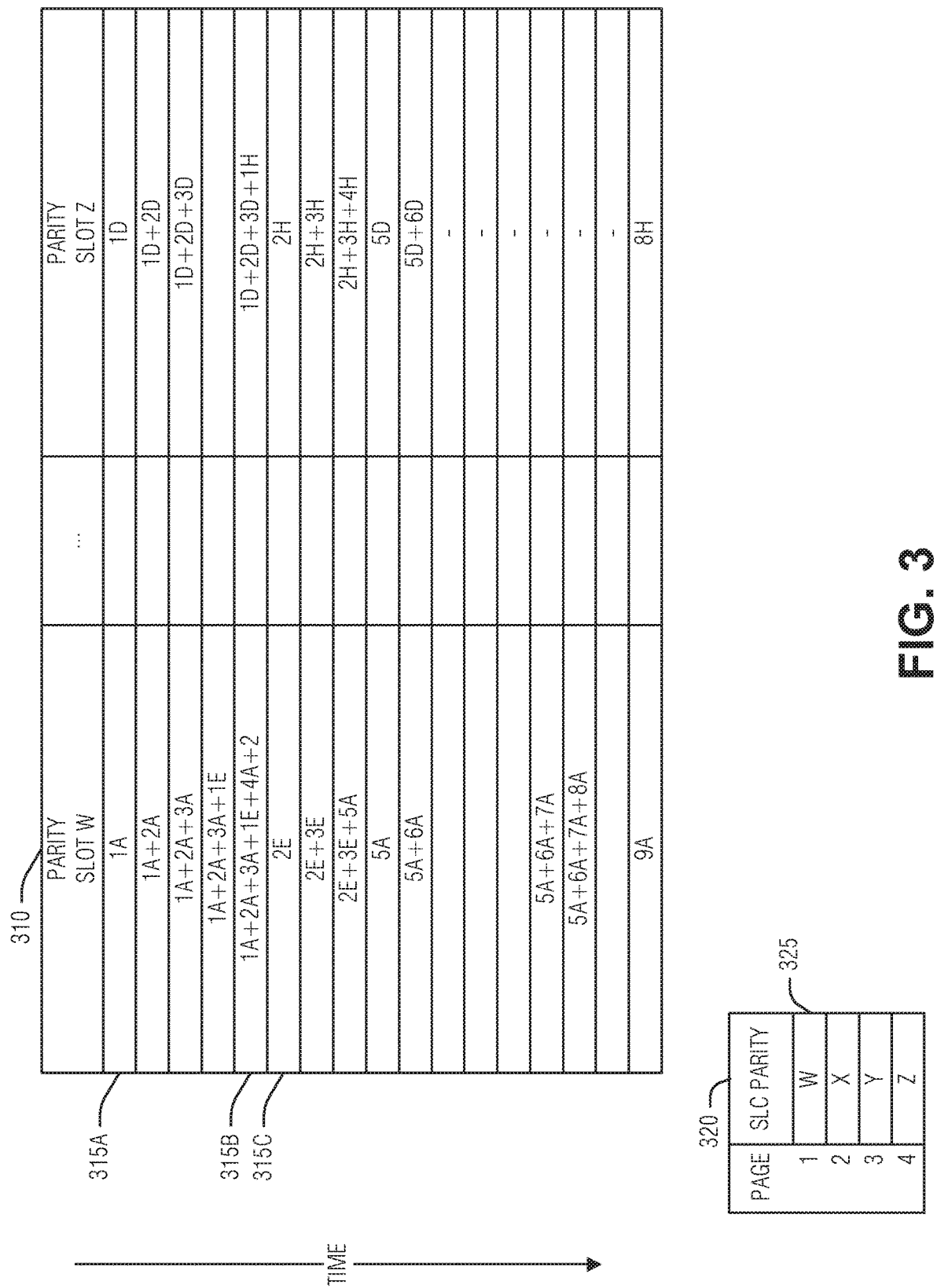
FIG. 3 illustrates an example of a mixed parity mapping for a RAIN.

FIG. 3 illustrates an example of a mixed parity mapping for a RAIN.

Using the same logical-to-physical mapping 205 described above with respect to FIG. 2, here the parity slot 310 is no longer correlated to the logical or the physical block. Instead, the parity slot 310 is one of one or more parity slots, the total number of parity slots being an implementation or tuning parameter.

Here, as time progresses for the parity slot 310, parity data derived from previous parity values of multiple logical blocks are accumulated. Thus, at time 315A, the parity slot value is the page 1A (e.g., the first page of logical block A). By the flush time 315B, the parity value includes XORed results of both logical blocks A and E. Then, the next time 315C holds a value of the next page from the logical block E. Thus, in contrast to the parity slot 210 values described above, the parity slot 310 holds parity data derived from multiple logical blocks.

When the parity slot 310 is flushed, the swap block 320 holds the parity value 325 based on the parity slot 310 and not the logical block. This change from the organization described with respect to FIG. 2 is due to the mixed nature of the parity value 325. Thus, as illustrated, the parity value 325 is the entanglement (e.g., coupling, mixing, etc.) of the parity data for multiple logical blocks.

To use the parity data for a given logical block, that parity data is disentangled (e.g., decoupled) from the parity data for other logical blocks. This disentanglement can occur when the swap block 320 is written to the destination physical block for the given logical block. In an example, the disentanglement can occur during the parity slot flush that writes to the swap block 320. Here, in contrast to what is illustrated in FIG. 3, the parity value 325 would pertain to a single logical block.

Figure 4:
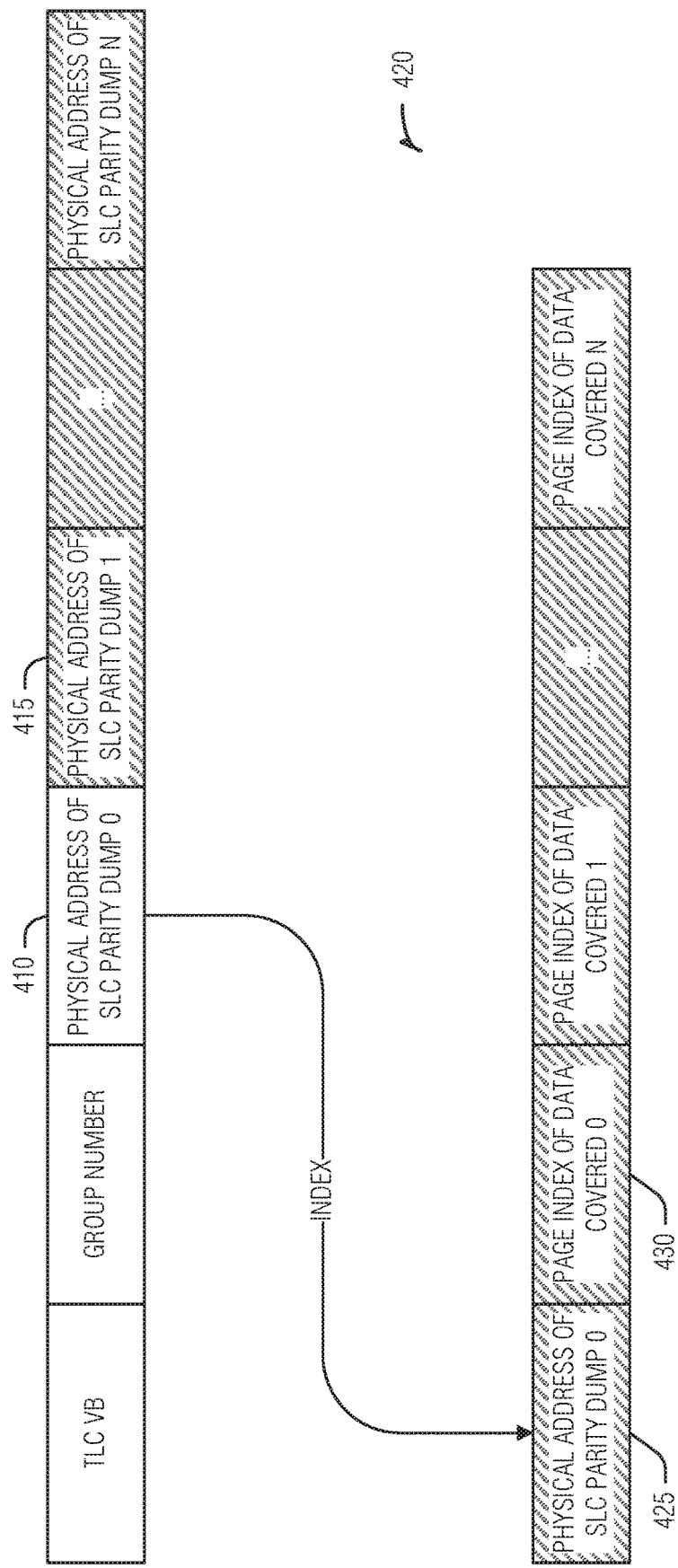
FIG. 4 illustrates an example of a RAIN data structure for mixed parity management.

FIG. 4 illustrates an example of a RAIN data structure for mixed parity management. The shaded fields are those that are added to traditional RAIN tracking structures in flash devices. For example, the structure 405 correlates to a traditional RAIN table entry. The structure 405 repurposes the physical address field 410 to be a pointer to an extended table entry 420. The extended table entry 420 can include a physical address field 425, and a series of page index fields, such as page index field 430, that indicate to which pages of the logical data block the parity data pertains.

The structure 405 is also modified to include additional pointers to additional extended entries. This enables complete parity data mapping for all pages of the virtual block (e.g., TLC VB). Because entry pointers are used instead of physical addresses, the amount of data consumed by the structure 405 is equivalent to that used for a traditional RAIN table entry.

Fields can be added to the extended table entry 420 can include additional fields to address mixed cursor management as described herein, partially populated fields, performance information, etc., depending on usage model. The illustrated structure 405 and extended table entry 420 can also improve traditional spinning RAIN techniques by enabling better management of anticipated flushes induced by power-state changes or auto-stand-by operations.

Figure 5:
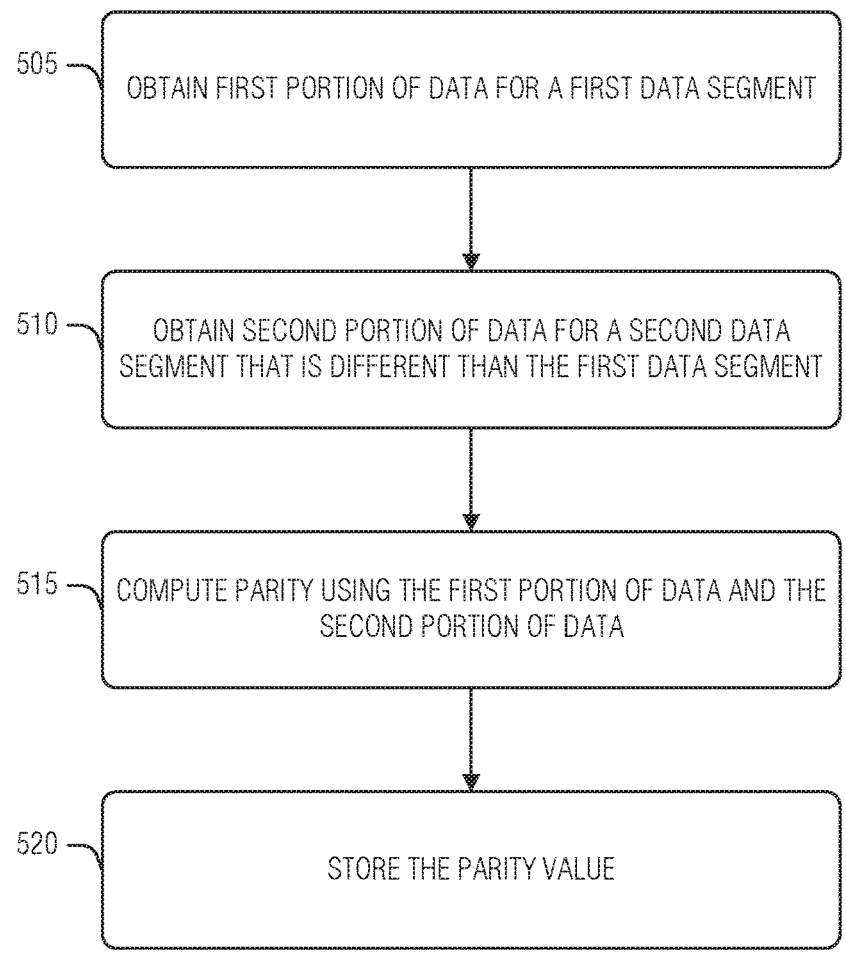
FIG. 5 illustrates a flowchart of a method for NAND device mixed parity management.

FIG. 5 illustrates a flowchart of a method 500 for NAND device mixed parity management. The operations of the method 500 are performed by computer hardware, such as that described above or below (e.g., a memory controller, array controller, processing circuitry etc.).

At operation 505, a first portion of data is received. Here, the first portion of data corresponds to a first data segment defined with respect to a structure of the NAND device. In an example, the structure of the NAND device that defines the first data segment is a block.

At operation 510, a second portion of data is received. The second portion of data, like the first portion of data, corresponds to a second data segment defined with respect to the structure of the NAND device. However, here, the second segment is different than the first segment. In an example, the first and second segments of data correspond to blocks. In an example, the blocks are logical (e.g., the first segment of data is the size of a physical block but does not correlate to a single physical block). In an example, the first portion of data and a third portion of data that is in the first segment of data are different pages allocated to different physical blocks in the NAND device.

At operation 515, a parity value is computed using the first portion of data and the second portion of data. In an example, the parity value is computed by applying an XOR operation between bits of the first portion of data and the second portion of data. In an example, to compute the parity value, includes maintaining a data structure to store a mapping between the first portion of data, the second portion of data, and the parity value.

At operation 520, the parity value is stored. In an example, the parity value is stored in random access memory. In an example, the parity value replaces a previous parity value for the first data segment in the random access memory. In an example, parity data stored in the random access memory is flushed to a physical block. In an example, flushing the parity data includes disentangling (e.g., decoupling) parity data for the first portion of data and the second portion of data from parity data derived from the parity value prior to writing the parity data to a swap block.

In an example, the parity data for the first portion of data and the second portion of data can be decoupled from parity data derived from the parity value in response to a trigger. In an example, the trigger is writing the parity data to a block of the NAND device to which the first portion of data was written. In an example, the trigger is a failed write of the first portion of data or the second portion of data to a block of the NAND device. In an example, the trigger is a verification error of a closed block of the NAND device to which the first portion of data or the second portion of data was written.

Figure 6:
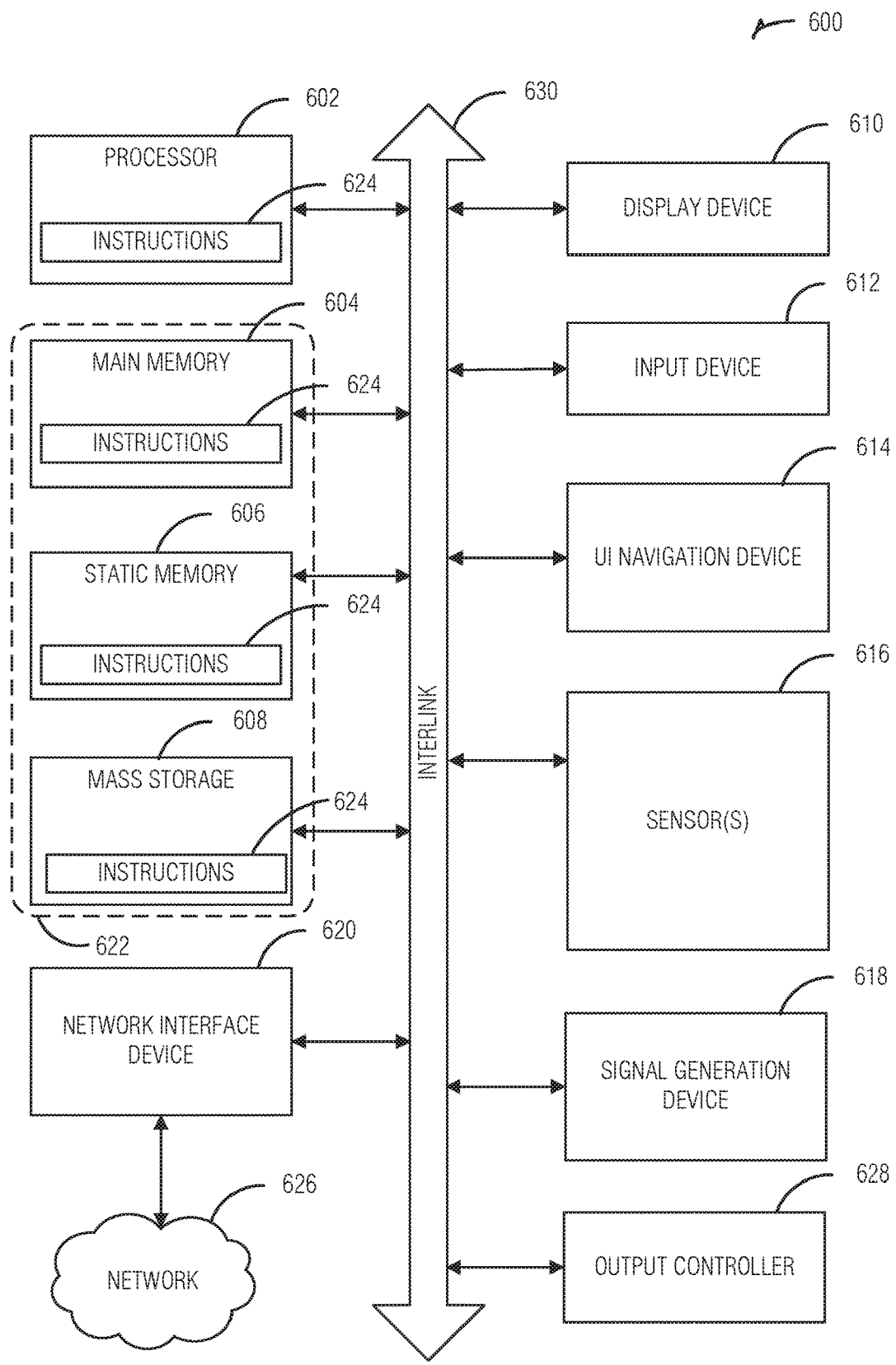
FIG. 6 is a block diagram illustrating an example of a machine upon which one or more embodiments can be implemented.

FIG. 6 illustrates a block diagram of an example machine 600 upon which any one or more of the techniques (e.g., methodologies) discussed herein can perform. In alternative embodiments, the machine 600 can operate as a standalone device or can be connected (e.g., networked) to other machines. In a networked deployment, the machine 600 can operate in the capacity of a server machine, a client machine, or both in server-client network environments. In an example, the machine 600 can act as a peer machine in peer-to-peer (P2P) (or other distributed) network environment. The machine 600 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 600 (e.g., the host device 105, the memory device 110, etc.) can include a hardware processor 602 (e.g., a central processing unit (CPU), a graphics processing unit (GPU), a hardware processor core, or any combination thereof, such as the memory controller 115, etc.), a main memory 604 and a static memory 606, some or all of which can communicate with each other via an interlink (e.g., bus) 608. The machine 600 can further include a display unit 610, an alphanumeric input device 612 (e.g., a keyboard), and a user interface (UI) navigation device 614 (e.g., a mouse). In an example, the display unit 610, input device 612 and UI navigation device 614 can be a touch screen display. The machine 600 can additionally include a storage device (e.g., drive unit) 608, a signal generation device 618 (e.g., a speaker), a network interface device 620, and one or more sensors 616, such as a global positioning system (GPS) sensor, compass, accelerometer, or other sensor. The machine 600 can include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 608 can include a machine readable medium 622 on which is stored one or more sets of data structures or instructions 624 (e.g., software) embodying or utilized by any one or more of the techniques or functions described herein. The instructions 624 can also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 608 can constitute the machine readable medium 622.

While the machine readable medium 622 is illustrated as a single medium, the term "machine readable medium" can include a single medium or multiple media (e.g., a centralized or distributed database, or associated caches and servers) configured to store the one or more instructions 624.

The term "machine readable medium" can include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, can be accessed by the memory 604 for use by the processor 602. The memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 621 can be allocated to supplement the memory 604; however, because the storage 621 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 621 for virtual memory can greatly reduce the usable lifespan of the storage device 621.

In contrast to virtual memory, virtual memory compression (e.g., the Linux® kernel feature "ZRAM") uses part of the memory as compressed block storage to avoid paging to the storage device 621. Paging takes place in the compressed block until it is necessary to write such data to the storage device 621. Virtual memory compression increases the usable size of memory 604, while reducing wear on the storage device 621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 624 can further be transmitted or received over a communications network 626 using a transmission medium via the network interface device 620 utilizing any one of a number of transfer protocols (e.g., frame relay, Internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks) such as those defined by the Third Generation Partnership Project (3GPP) families of standards (e.g., 3G, 4G, 5G, Long Term Evolution (LTE), etc.), Plain Old Telephone (POTS) networks, and wireless data networks (e.g., Institute of Electrical and Electronics Engineers (IEEE) 802.11 family of standards known as Wi-Fr), IEEE 802.15.4 family of standards, peer-to-peer (P2P) networks, among others. In an example, the network interface device 620 can include one or more physical jacks (e.g., Ethernet, coaxial, or phone jacks) or one or more antennas to connect to the communications network 626. In an example, the network interface device 620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that can store, encoding or carrying instructions for execution by the machine 600, and includes digital or analog communications signals or other intangible medium to facilitate communication of such software.

ADDITIONAL EXAMPLES

Example 1 is an controller for NAND device mixed parity management, the controller comprising: volatile memory; and processing circuitry to: receive a first portion of data, the first portion of data corresponding to a first data segment defined with respect to a structure of the NAND device; receive a second portion of data, the second portion of data corresponding to a second data segment defined with respect to the structure of the NAND device, the second data segment different than the first segment; compute a parity value using the first portion of data and the second portion of data; and store the parity value in the volatile memory.

In Example 2, the subject matter of Example 1, wherein, to compute the parity value, the processing circuitry applies an exclusive or (XOR) operation between bits of the first portion of data and the second portion of data.

In Example 3, the subject matter of any of Examples 1-2, wherein, to compute the parity value, the processing circuitry maintains a data structure to store a mapping between the first portion of data, the second portion of data, and the parity value.

In Example 4, the subject matter of any of Examples 1-3, wherein the volatile memory is random access memory.

In Example 5, the subject matter of Example 4, wherein the parity value replaces a previous parity value for the first data segment in the random access memory.

In Example 6, the subject matter of any of Examples 4-5, wherein the processing circuitry is arranged to flush parity data stored in the random access memory to a NAND block.

In Example 7, the subject matter of Example 6, wherein, to flush the parity data, the processing circuitry decouples parity data for the first portion of data and the second portion of data from parity data derived from the parity value prior to writing the parity data to a swap block.

In Example 8, the subject matter of any of Examples 1-7, wherein the processing circuitry is arranged to decouple parity data for the first portion of data and the second portion of data from parity data derived from the parity value in response to a trigger.

In Example 9, the subject matter of Example 8, wherein the trigger is a failed write of the first portion of data or the second portion of data to a block of the NAND device.

In Example 10, the subject matter of any of Examples 8-9, wherein the trigger is a verification error of a closed block of the NAND device to which the first portion of data or the second portion of data was written.

In Example 11, the subject matter of any of Examples 8-10, wherein the trigger is writing the parity data to a block of the NAND device to which the first portion of data was written.

In Example 12, the subject matter of any of Examples 1-11, wherein the structure of the NAND device that defines the first data segment and the second data segment is a block.

In Example 13, the subject matter of Example 12, wherein the block is logical, and wherein the first portion of data and a third portion of data that is in the first segment of data are different pages allocated to different physical blocks the NAND device.

Example 14 is a method for NAND device mixed parity management, the method comprising: receiving a first portion of data, the first portion of data corresponding to a first data segment defined with respect to a structure of the NAND device; receiving a second portion of data, the second portion of data corresponding to a second data segment defined with respect to the structure of the NAND device, the second data segment different than the first segment; computing a parity value using the first portion of data and the second portion of data; and storing the parity value.

In Example 15, the subject matter of Example 14, wherein computing the parity value includes applying an exclusive or (XOR) operation between bits of the first portion of data and the second portion of data.

In Example 16, the subject matter of any of Examples 14-45, wherein computing the parity value includes maintaining a data structure to store a mapping between the first portion of data, the second portion of data, and the parity value.

In Example 17, the subject matter of any of Examples 14-16, wherein the parity value is stored in random access memory.

In Example 18, the subject matter of Example 17, wherein the parity value replaces a previous parity value for the first data segment in the random access memory.

In Example 19, the subject matter of any of Examples 17-18, comprising flushing parity data stored in the random access memory to a NAND block.

In Example 20, the subject matter of Example 19, wherein flushing the parity data includes decoupling parity data for the first portion of data and the second portion of data from parity data derived from the parity value prior to writing the parity data to a swap block.

In Example 21, the subject matter of any of Examples 14-20, comprising decoupling parity data for the first portion of data and the second portion of data from parity data derived from the parity value in response to a trigger.

In Example 22, the subject matter of Example 21, wherein the trigger is a failed write of the first portion of data or the second portion of data to a block of the NAND device.

In Example 23, the subject matter of any of Examples 21-22, wherein the trigger is a verification error of a closed block of the NAND device to which the first portion of data or the second portion of data was written.

In Example 24, the subject matter of any of Examples 21-23, wherein the trigger is writing the parity data to a block of the NAND device to which the first portion of data was written.

In Example 25, the subject matter of any of Examples 14-24, wherein the structure of the NAND device that defines the first data segment and the second data segment is a block.

In Example 26, the subject matter of Example 25, wherein the block is logical, and wherein the first portion of data and a third portion of data that is in the first segment of data are different pages allocated to different physical blocks the NAND device.

Example 27 is a machine readable medium including instructions for NAND device mixed parity management, the instructions, when executed by processing circuitry, cause the processing circuitry to perform operations comprising: receiving a first portion of data, the first portion of data corresponding to a first data segment defined with respect to a structure of a NAND device; receiving a second portion of data, the second portion of data corresponding to a second data segment defined with respect to the structure of the NAND device, the second data segment different than the first segment; computing a parity value using the first portion of data and the second portion of data; and storing the parity value.

In Example 28, the subject matter of Example 27, wherein computing the parity value includes applying an exclusive or (XOR) operation between bits of the first portion of data and the second portion of data.

In Example 29, the subject matter of any of Examples 27-28, wherein computing the parity value includes maintaining a data structure to store a mapping between the first portion of data, the second portion of data, and the parity value.

In Example 30, the subject matter of any of Examples 27-29, wherein the parity value is stored in random access memory.

In Example 31, the subject matter of Example 30, wherein the parity value replaces a previous parity value for the first data segment in the random access memory.

In Example 32, the subject matter of any of Examples 30-31, wherein the operations comprise flushing parity data stored in the random access memory to a NAND block.

In Example 33, the subject matter of Example 32, wherein flushing the parity data includes decoupling parity data for the first portion of data and the second portion of data from parity data derived from the parity value prior to writing the parity data to a swap block.

In Example 34, the subject matter of any of Examples 27-33, wherein the operations comprise decoupling parity data for the first portion of data and the second portion of data from parity data derived from the parity value in response to a trigger.

In Example 35, the subject matter of Example 34, wherein the trigger is a failed write of the first portion of data or the second portion of data to a block of the NAND device.

In Example 36, the subject matter of any of Examples 34-35, wherein the trigger is a verification error of a closed block of the NAND device to which the first portion of data or the second portion of data was written.

In Example 37, the subject matter of any of Examples 34-36, wherein the trigger is writing the parity data to a block of the NAND device to which the first portion of data was written.

In Example 38, the subject matter of any of Examples 27-37, wherein the structure of the NAND device that defines the first data segment and the second data segment is a block.

In Example 39, the subject matter of Example 38, wherein the block is logical, and wherein the first portion of data and a third portion of data that is in the first segment of data are different pages allocated to different physical blocks the NAND device.

Example 40 is a system for NAND device mixed parity management, the system comprising: means for receiving a first portion of data, the first portion of data corresponding to a first data segment defined with respect to a structure of the NAND device; means for receiving a second portion of data, the second portion of data corresponding to a second data segment defined with respect to the structure of the NAND device, the second data segment different than the first segment; means for computing a parity value using the first portion of data and the second portion of data; and means for storing the parity value.

In Example 41, the subject matter of Example 40, wherein the means for computing the parity value include means for applying an exclusive or (XOR) operation between bits of the first portion of data and the second portion of data.

In Example 42, the subject matter of any of Examples 40-41, wherein the means for computing the parity value include means for maintaining a data structure to store a mapping between the first portion of data, the second portion of data, and the parity value.

In Example 43, the subject matter of any of Examples 40-42, wherein the parity value is stored in random access memory.

In Example 44, the subject matter of Example 43, wherein the parity value replaces a previous parity value for the first data segment in the random access memory.

In Example 45, the subject matter of any of Examples 43-44, comprising means for flushing parity data stored in the random access memory to a NAND block.

In Example 46, the subject matter of Example 45, wherein the means for flushing the parity data include means for decoupling parity data for the first portion of data and the second portion of data from parity data derived from the parity value prior to writing the parity data to a swap block.

In Example 47, the subject matter of any of Examples 40-46, comprising means for decoupling parity data for the first portion of data and the second portion of data from parity data derived from the parity value in response to a trigger.

In Example 48, the subject matter of Example 47, wherein the trigger is a failed write of the first portion of data or the second portion of data to a block of the NAND device.

In Example 49, the subject matter of any of Examples 47-48, wherein the trigger is a verification error of a closed block of the NAND device to which the first portion of data or the second portion of data was written.

In Example 50, the subject matter of any of Examples 47-49, wherein the trigger is writing the parity data to a block of the NAND device to which the first portion of data was written.

In Example 51, the subject matter of any of Examples 40-50, wherein the structure of the NAND device that defines the first data segment and the second data segment is a block.

In Example 52, the subject matter of Example 51, wherein the block is logical, and wherein the first portion of data and a third portion of data that is in the first segment of data are different pages allocated to different physical blocks the NAND device.

Example 53 is at least one machine-readable medium including instructions that, when executed by processing circuitry, cause the processing circuitry to perform operations to implement of any of Examples 1-52.

Example 54 is an apparatus comprising means to implement of any of Examples 1-52.

Example 55 is a system to implement of any of Examples 1-52.

Example 56 is a method to implement of any of Examples 1-52.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A controller for NAND device mixed parity management, the controller comprising:
   volatile memory; and
   processing circuitry to:
      receive a first portion of data, the first portion of data corresponding to a first data segment defined with respect to a structure of the NAND device;
      receive a second portion of data, the second portion of data corresponding to a second data segment defined with respect to the structure of the NAND device, the second data segment different than the first segment;
      compute a parity value using the first portion of data and the second portion of data;
      store the parity value in the volatile memory; and
      decouple parity data for the first portion of data and the second portion of data from parity data derived from the parity value in response to a trigger.

2. The controller of claim 1, wherein the volatile memory is random access memory.

3. The controller of claim 2, wherein the parity value replaces a previous parity value for the first data segment in the random access memory.

4. The controller of claim 2, wherein the processing circuitry is arranged to flush parity data stored in the random access memory to a NAND block.

5. The controller of claim 4, wherein, to flush the parity data, the processing circuitry decouples parity data for the first portion of data and the second portion of data from parity data derived from the parity value prior to writing the parity data to a swap block.

6. The controller of claim 1, wherein the trigger is a failed write of the first portion of data or the second portion of data to a block of the NAND device.

7. The controller of claim 1, wherein the trigger is a verification error of a closed block of the NAND device to which the first portion of data or the second portion of data was written.

8. The array controller of claim 1, wherein, to compute the parity value, the processing circuitry maintains a data structure to store a mapping between the first portion of data, the second portion of data, and the parity value.

9. A method for NAND device mixed parity management, the method comprising:
   receiving a first portion of data, the first portion of data corresponding to a first data segment defined with respect to a structure of the NAND device;
   receiving a second portion of data, the second portion of data corresponding to a second data segment defined with respect to the structure of the NAND device, the second data segment different than the first segment;
   computing a parity value using the first portion of data and the second portion of data;
   storing the parity value; and
   decoupling parity data for the first portion of data and the second portion of data from parity data derived from the parity value in response to a trigger.

10. The method of claim 9, wherein the parity value is stored in random access memory.

11. The method of claim 10, wherein the parity value replaces a previous parity value for the first data segment in the random access memory.

12. The method of claim 10, comprising flushing parity data stored in the random access memory to a NAND block.

13. The method of claim 12, wherein flushing the parity data includes decoupling parity data for the first portion of data and the second portion of data from parity data derived from the parity value prior to writing the parity data to a swap block.

14. The method of claim 9, wherein the trigger is a failed write of the first portion of data or the second portion of data to a block of the NAND device.

15. The method of claim 9, wherein the trigger is a verification error of a closed block of the NAND device to which the first portion of data or the second portion of data was written.

16. The method of claim 9, wherein computing the parity value includes maintaining a data structure to store a mapping between the first portion of data, the second portion of data, and the parity value.

17. A non-transitory machine readable medium including instructions for NAND device mixed parity management, the instructions, when executed by processing circuitry, cause the processing circuitry to perform operations comprising:
- receiving a first portion of data, the first portion of data corresponding to a first data segment defined with respect to a structure of a NAND device;
- receiving a second portion of data, the second portion of data corresponding to a second data segment defined with respect to the structure of the NAND device, the second data segment different than the first segment;
- computing a parity value using the first portion of data and the second portion of data;
- storing the parity value; and
- decoupling parity data for the first portion of data and the second portion of data from parity data derived from the parity value in response to a trigger.

18. The non-transitory machine readable medium of claim 17, wherein the parity value is stored in random access memory.

19. The non-transitory machine readable medium of claim 18, wherein the parity value replaces a previous parity value for the first data segment in the random access memory.

20. The non-transitory machine readable medium of claim 18, wherein the operations comprise flushing parity data stored in the random access memory to a NAND block.

21. The non-transitory machine readable medium of claim 20, wherein flushing the parity data includes decoupling parity data for the first portion of data and the second portion of data from parity data derived from the parity value prior to writing the parity data to a swap block.

22. The non-transitory machine readable medium of claim 17, wherein the trigger is a failed write of the first portion of data or the second portion of data to a block of the NAND device.

23. The machine readable medium of claim 17, wherein the trigger is a verification error of a closed block of the NAND device to which the first portion of data or the second portion of data was written.

24. The non-transitory machine readable medium of claim 17, wherein computing the parity value includes maintaining a data structure to store a mapping between the first portion of data, the second portion of data, and the parity value.

* * * * *